(12) United States Patent  
Weber et al.

(10) Patent No.: US 8,742,550 B2  
(45) Date of Patent: Jun. 3, 2014

(54) CHARGE COMPENSATION SEMICONDUCTOR DEVICE

(75) Inventors: Hans Weber, Bayerisch Gmain (DE); Franz Hirler, Isen (DE)

(73) Assignee: Infineon Technologies Austria AG, Villach (AT)

( * ) Notice: Subject to any disclaimer, the term of this patent is extended or adjusted under 35 U.S.C. 154(b) by 6 days.

(21) Appl. No.: 13/541,884

(22) Filed: Jul. 5, 2012

(65) Prior Publication Data

US 2014/0008717 A1   Jan. 9, 2014

(51) Int. Cl.
*H01L 21/02* (2006.01)

(52) U.S. Cl.
USPC .......................................... 257/655; 257/330

(58) Field of Classification Search
USPC .................................................. 257/655, 330
See application file for complete search history.

(56) References Cited

U.S. PATENT DOCUMENTS

| | | | |
|---|---|---|---|
| 6,734,520 B2 | 5/2004 | Kapels et al. | |
| 7,332,788 B2 * | 2/2008 | Ahlers et al. | 257/502 |
| 7,750,397 B2 | 7/2010 | Hirler et al. | |
| 2002/0096708 A1 | 7/2002 | Ahlers et al. | |
| 2005/0045922 A1 | 3/2005 | Ahlers et al. | |
| 2005/0082591 A1 | 4/2005 | Hirler et al. | |
| 2007/0085136 A1 | 4/2007 | Krumrey et al. | |
| 2007/0126056 A1 | 6/2007 | Hirler | |
| 2007/0138544 A1 | 6/2007 | Hirler et al. | |
| 2008/0258208 A1 | 10/2008 | Hirler et al. | |
| 2008/0265329 A1 | 10/2008 | Hirler et al. | |
| 2011/0133262 A1 * | 6/2011 | Wahl et al. | 257/296 |
| 2012/0088353 A1 * | 4/2012 | Willmeroth et al. | 438/460 |

FOREIGN PATENT DOCUMENTS

| | | |
|---|---|---|
| DE | 102005047056 B3 | 1/2007 |
| DE | 102005041322 A1 | 3/2007 |
| DE | 102007018631 B4 | 1/2009 |

* cited by examiner

*Primary Examiner* — Kyoung Lee  
*Assistant Examiner* — Ratisha Mehta  
(74) *Attorney, Agent, or Firm* — Murphy, Bilak & Homiller, PLLC

(57) ABSTRACT

A semiconductor device is provided. The semiconductor device includes a semiconductor body and a source metallization which is arranged on the semiconductor body. The semiconductor body includes in a cross-section a drift region of a first conductivity type, a first body region of a second conductivity type which adjoins the drift region, a first compensation region of the second conductivity type which adjoins the first body region, has a lower maximum doping concentration than the first body region and forms a first pn-junction with the drift region, and a first charge trap. The first charge trap adjoins the first compensation region and includes a field plate and an insulating region which adjoins the drift region and partly surrounds the field plate. The source metallization is arranged in resistive electric connection with the first body region. Further, a method for producing a semiconductor device is provided.

25 Claims, 9 Drawing Sheets

CHARGE COMPENSATION SEMICONDUCTOR DEVICE

TECHNICAL FIELD

Embodiments of the present invention relate to semiconductor devices having charge compensation structures, in particular to power semiconductor transistors having charge compensation structures, and to related methods for producing semiconductor devices.

BACKGROUND

Semiconductor transistors, in particular field-effect controlled switching devices such as a Metal Oxide Semiconductor Field Effect Transistor (MOSFET) or an Insulated Gate Bipolar Transistor (IGBT) have been used for various applications including but not limited to use as switches in power supplies and power converters, electric cars, air-conditioners, and even stereo systems. Particularly with regard to power devices capable of switching large currents and/or operating at higher voltages, low on-state resistance Ron and high breakdown voltages $U_{bd}$ are often desired.

For this purpose charge compensation semiconductor devices were developed. The compensation principle is based on a mutual compensation of charges in n- and p-doped zones in the drift region of a MOSFET.

Typically, the charge compensation structure formed by p-type and n-type zones is for vertical charge compensation MOSFETs arranged below the actual MOSFET-structure with source regions, body regions and gate regions, and also below the associated MOS-channels which are arranged next to one another in the semiconductor volume of the semiconductor device or interleaved in one another in such a way that, in the off-state, their charges can be mutually depleted and that, in the activated state or on-state, there results an uninterrupted, low-impedance conduction path from a source electrode near the surface to a drain electrode arranged on the back side.

By virtue of the compensation of the p-type and n-type dopings, the doping of the current-carrying region can be significantly increased in the case of compensation components which results in a significant reduction of the on-state resistance Ron despite the loss of a current-carrying area. The reduction of the on-state resistance Ron of such semiconductor power devices is associated with a reduction of the heat loss, so that such semiconductor power devices with charge compensation structure remain "cool" compared with conventional semiconductor power devices.

Meanwhile, switching losses of semiconductor devices become more important. Depending on device operation, output charge $Q_{OSS}$ and electric energy $E_{OSS}$, respectively, stored in the space charge region formed in the off-state and during reverse bias, respectively, mainly determine the switching losses. The stored charge $Q_{OSS}$ of semiconductor devices with charge compensation structures may be comparatively high. This may result in significant switching losses $E_{OSS}$. In addition to enable reverse blocking, the output charge $Q_{OSS}$ (at specific blocking voltage) has to be completely removed which results in switching delays.

Furthermore, to achieve both low on-state resistance Ron and high blocking voltage it is desirable that the dopings of the p-type and n-type zones of the charge compensation structure are well balanced. This typically poses high requirements for manufacturing and may limit down-scaling of the devices. For example, several processes of epitaxial growth and masked implantation followed by thermal drive-in may be used to form the charge compensation structure. During thermal drive-in, the implanted structures also grow in lateral direction. This limits the pitch between the p-type and n-type zones of the charge compensation structure.

Accordingly, there is a need to reduce switching losses and switching delays of semiconductor devices with charge compensation structures and to improve manufacturing of those devices.

SUMMARY

According to an embodiment of a semiconductor device, the semiconductor device includes a semiconductor body and a source metallization which is arranged on the semiconductor body. The semiconductor body includes in a cross-section a drift region of a first conductivity type, a first body region of a second conductivity type which adjoins the drift region, a first compensation region of the second conductivity type which adjoins the first body region, has a lower maximum doping concentration than the first body region and forms a first pn-junction with the drift region, and a first charge trap. The first charge trap adjoins the first compensation region and includes a field plate and an insulating region which adjoins the drift region and partly surrounds the field plate. The source metallization is arranged in resistive electric connection with the first body region.

According to an embodiment of a semiconductor device, the semiconductor device includes a semiconductor body and a source metallization. The semiconductor body has a first surface and includes a drift region of a first conductivity type, a plurality of compensation regions of a second conductivity type each of which forms a pn-junction with the drift region and adjoins a respective body region of the second conductivity type which has a higher maximum doping concentration than the adjoining compensation region, and a plurality of charge traps each of which comprises a field plate and a insulating region which partly surrounds the field plate. Each of the plurality of charge traps adjoins at least one of the plurality of compensation regions. The source metallization is arranged on the first surface and is in resistive electric connection with each of the compensation regions.

According to an embodiment of a method for producing a semiconductor device, the method includes: providing a semiconductor body having a main surface with a normal direction and including a semiconductor layer of a first conductivity type extending to the main surface; forming in the semiconductor body a plurality a charge trap structures each of which comprises a field plate which is, in a cross-section which is substantially orthogonal to the main surface, partly surrounded by a insulating region; forming a plurality of compensation regions of a second conductivity type so that each compensation region forms a respective pn-junction within the semiconductor body and that each compensation region adjoins, in the cross-section, at least one of the charge trap structures; and forming a source metallization in resistive electric connection with each of the plurality of compensation regions.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

Figure 1:
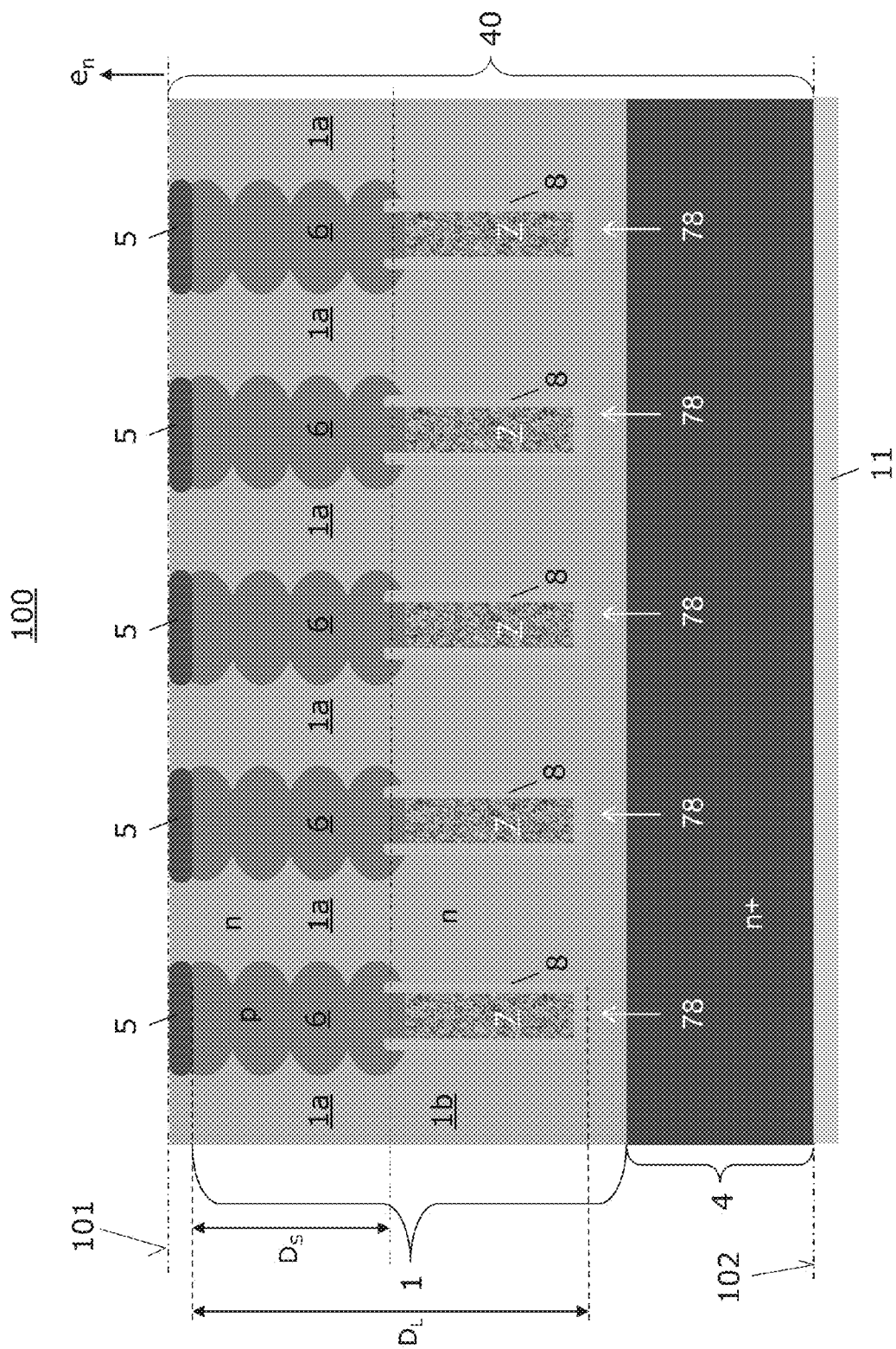
FIG. 1 illustrates a vertical cross-section through a semiconductor body of a semiconductor device according to an embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first or main horizontal surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate of semiconductor body is considered to be formed by the lower or backside surface while the first surface is considered to be formed by the upper, front or main surface of the semiconductor substrate. The terms "above" and "below" as used in this specification therefore describe a relative location of a structural feature to another structural feature with consideration of this orientation.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "n−" means a doping concentration which is less than the doping concentration of an "n"-doping region while an "n+"-doping region has a larger doping concentration than the "n"-doping region. However, indicating the relative doping concentration does not mean that doping regions of the same relative doping concentration have to have the same absolute doping concentration unless otherwise stated. For example, two different n+-doping regions can have different absolute doping concentrations. The same applies, for example, to an n+-doping and a p+-doping region.

Specific embodiments described in this specification pertain to, without being limited thereto, to semiconductor devices, in particular to field effect semiconductor transistor and manufacturing methods therefor. Within this specification the terms "semiconductor device" and "semiconductor component" are used synonymously. The semiconductor device is typically a MOSFET having a pn-junction forming a body diode between a drift region of the first conductivity type and a body region of the second conductivity type, for example a vertical MOSFET with a source metallization and an insulated gate electrode which are arranged on the first surface and a drain metallization which is connected to the drain region and arranged on a second surface opposite to the first surface.

The term "commutating" as used in this specification intends to describe the switching of the current of a semiconductor device from a forward direction or conducting direction in which a pn-load junction, for example the pn-junction between the body region and the drift region of a MOSFET, is forwardly biased to the opposite direction or reverse direction in which the pn-load junction is reversely biased. Operating the semiconductor device with reversely biased pn-load junction is in the following also referred to as operating the semiconductor device in a blocking mode. Likewise, operating the semiconductor device with forwardly biased pn-load junction is in the following also referred to as operating the semiconductor device in a forward mode. The term "hard commutating" as used in this specification intends to describe commutating with a speed of at least about $10^{10}$ V/s, more typically with a speed of at least about $2*10^{10}$ V/s.

Typically, the semiconductor device is a power semiconductor device having an active area with a plurality of MOSFET-cells for carrying and/or controlling a load current. Furthermore, the power semiconductor device has typically a peripheral area with at least one edge-termination structure at least partially surrounding the active area when seen from above.

The term "power semiconductor device" as used in this specification intends to describe a semiconductor device on a single chip with high voltage and/or high current switching capabilities. In other words, power semiconductor devices are intended for high current, typically in the Ampere range. Within this specification the terms "power semiconductor device" and "power semiconductor component" are used synonymously.

The term "field-effect" as used in this specification intends to describe the electric-field mediated formation of a conductive "channel" of a first conductivity type and/or control of conductivity and/or shape of the channel in a semiconductor region of a second conductivity type, typically a body region of the second conductivity type. Due to the field-effect, a unipolar current path through the channel region is formed and/or controlled between a source region or emitter region of the first conductivity type and a drift region of the first conductivity type. The drift region may be in contact with a drain region or a collector region respectively. The drain region or the collector region is in low resistive electric contact with a drain or collector electrode. The source region or emitter region is in low resistive electric contact with a source or emitter electrode.

In the context of the present specification, the terms "in resistive electric contact" and "in resistive electric connection" intend to describe that there is a resistive current path between respective elements or portions of a semiconductor device at least when no voltages are applied to and/or across the semiconductor device. Likewise, the terms "in low resistive electric contact" and "in low resistive electric connection" intend to describe that there is a low resistive current path between respective elements or portions of a semiconductor device at least when no voltages are applied to and/or across the semiconductor device. Within this specification the terms "in low resistive electric contact", "electrically coupled", and "in low resistive electric connection" are used synonymously. In some embodiments, the resistivity of a low resistive current path between respective elements or portions of a semiconductor device which is low when low voltages are applied to and/or across the semiconductor device, for example a probe voltage of less than one or a few volts, becomes high above a threshold voltage, for example due to depleting a semiconductor region forming at least a part of the current path.

In the context of the present specification, the term "MOS" (metal-oxide-semiconductor) should be understood as including the more general term "MIS" (metal-insulator-semiconductor). For example, the term MOSFET (metal-oxide-semiconductor field-effect transistor) should be understood to include FETs having a gate insulator that is not an oxide, i.e. the term MOSFET is used in the more general term meaning of IGFET (insulated-gate field-effect transistor) and MISFET (metal-insulator-semiconductor field-effect transistor), respectively.

In the context of the present specification, the term "gate electrode" intends to describe an electrode which is situated next to, and insulated from the body region and configured to form and/or control a channel region through the body region.

In the context of the present specification, the term "field plate" intends to describe an electrode which is arranged next to a semiconductor region, typically the drift region, partially insulated from the semiconductor region, and configured to expand a depleted portion in the semiconductor region by charging to an appropriate voltage, typically a negative voltage with regard to the surrounding semiconductor region for an n-type semiconductor region.

Typically, the field plate includes a conductive region forming the electrode, is arranged in a semiconductor body and is only partly insulated from the semiconductor body by an insulating region. Typically, the field plate is, in a vertical cross-section, insulated from the semiconductor body by the insulating region at three sides, such that the structure formed by the partly insulated field plate is configured to trap, during the blocking mode, charges, typically negative charges for an n-type semiconductor region adjoining the insulating region, so that a portion of the semiconductor region is depleted by the trapped charges. The structure formed by the field plate and the adjoining insulating region is in the following also referred to as charge trap. The conductive region is typically made of a material with high enough electric conductivity so that the conductive region forms an equipotential region during device operation. For example, the conductive region may be made of a material with metallic or near-metallic electric conductivity such as a metal, for example wolfram, highly doped poly-silicon, a silicide or the like. The conductive region may also be made of a doped monocrystalline semiconductor region, typically a monocrystalline semiconductor region of the second conductivity type. Furthermore, the field plate may include a weakly doped monocrystalline semiconductor region in which an electron channel may be formed. Typically, the conductive region is in resistive electric connection with the source metallization of the MOSFET. The insulating region may be made of any suitable dielectric material such as silicon oxide, for example thermal silicon oxide, silicon nitride, siliconoxynitride or the like.

In the context of the present specification, the term "self-charging charge trap" intends to describe a charge trap which is configured to generate and trap electric charges during the blocking-mode of the semiconductor device and/or during commutating the semiconductor device. The term "self-charging charge trap" shall embrace a charge trap having a field plate which includes charge generation centers for generating electron-hole pairs during commutating the semiconductor device and/or during the blocking-mode of the semiconductor device. Further, the term "self-charging charge trap" shall embrace a floating field-plate having at least in an opening region in contact with the surrounding semiconductor material a moderately or highly n-doped field stop portion in the field plate and/or in the surrounding semiconductor material. During commutating the semiconductor device and/or during the blocking-mode of the semiconductor device, electrons may be released in the field stop portion and trapped in the self-charging charge trap. The doping concentration of the field stop portion is chosen such that the electric field formed during commutating and/or during the blocking-mode is stopped in or next to the field stop portion.

In the context of the present specification, the term "mesa" or "mesa region" intends to describe a semiconductor region between two adjacent trenches extending into the semiconductor substrate or body in a vertical cross-section.

In the following, embodiments pertaining to semiconductor devices and manufacturing methods for forming semiconductor devices are explained mainly with reference to silicon (Si) semiconductor devices. Accordingly, a monocrystalline semiconductor region or layer is typically a monocrystalline Si-region or Si-layer. It should, however, be understood that the semiconductor body can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor applications currently mainly Si, SiC, GaAs and GaN materials are used. If the semiconductor body comprises a high band gap material such as SiC or GaN which has a high breakdown voltage and high critical avalanche field strength, respectively, the doping of the respective semiconductor regions can be chosen higher which reduces the on-state resistance Ron in the following also referred to as on-resistance Ron.

With reference to FIG. 1, a first embodiment of a semiconductor device 100 is explained. FIG. 1 illustrates a vertical cross-section through a semiconductor body 40 of the semiconductor device 100. The semiconductor body 40 extends between a first surface 101 which has a normal direction defining a vertical direction $e_n$ and a second surface 102 which is arranged opposite to the first surface 101. The vertical cross-section is in the following also referred to as first cross-section and cross-section, respectively. A first metallization (not shown in FIG. 1), typically forming a source metallization, is typically arranged on the first surface 101. A second metallization 11, typically forming a drain metallization, is arranged on the second surface 102. Furthermore, a third metallization (also not shown in FIG. 1), typically forming a gate metallization, is typically also arranged on the first surface 101 and insulated from the first metallization and semiconductor body 40. Accordingly, the semiconductor device 100 may be operated as a three-terminal device.

The semiconductor body 40 typically includes a bulk mono-crystalline material 4 and at least one epitaxial layer 1 formed thereon. Using the epitaxial layer(s) 1 provides more freedom in tailoring the background doping of the material since the doping concentration can be adjusted during deposition of the epitaxial layer or layers.

In the exemplary embodiment illustrated in FIG. 1, the semiconductor body 40 includes an n-type first semiconductor layer 1 extending to the first surface 101 and an n$^+$-type semiconductor layer 4 which is arranged below and adjoins the first semiconductor layer 1, extends to the second surface 102 and typically forms a drain contact layer or drain contact region.

According to an embodiment, the first semiconductor layer 1 includes a plurality of p-type body regions 5 and a pn-compensation-structure having p-type compensation regions 6 each of which adjoins a respective body region 5. The p-type compensation regions 6 are, in the vertical cross-section, arranged vertically between remaining n-type portions 1a of the first semiconductor layer 1 forming an upper portion 1a of a drift region, which is in the following also referred to as first portion 1a of the drift region. The p-type compensation regions 6 and the remaining n-type portions 1a form respective pn-junctions. A maximum doping concentration of the p-type body regions 5 is typically higher than a maximum doping concentration of the p-type compensation regions 6.

In the exemplary embodiment, the p-type compensation regions 6 are formed as vertically orientated pillars. Alternatively, the p-type compensation regions 6 are formed as substantially vertically orientated strip-type parallelepipeds.

Figure 2:
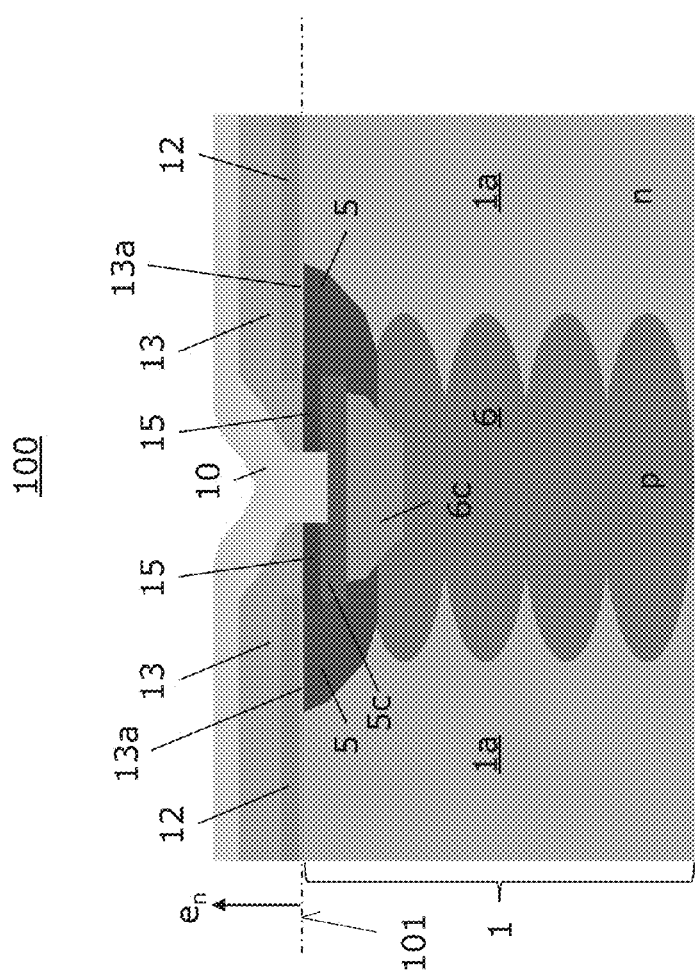
FIG. 2 illustrates a section of the vertical cross-section through the semiconductor device illustrated in FIG. 1 according to an embodiment.

The compensation regions 6 are in low resistive electric connection with the source metallization. This is explained with regard to FIG. 2 illustrating an enlarged section of the first semiconductor layer 1 illustrated in FIG. 1 and the structures typically formed on the first surface 101. The illustrated section of FIG. 2 typically corresponds to one of a plurality of unit cells of the first semiconductor layer 1 and an upper part of the semiconductor device 100, respectively.

In the exemplary embodiment, a p$^+$-type body contact region 5c and an n$^+$-type source region 15 are formed in the body region 5. Further, a p$^+$-type contact region 6c extends between the body contact region 5c and compensation region 6. The body contact region 5c, source region 15 and contact region 6c are not shown in FIG. 1 and the following Figures for sake of clarity.

A dielectric region 13 is arranged on the first surface 101. A portion 13a of dielectric region 13 is arranged between the first surface 101 and the gate electrode 12 which extends in a horizontal direction from the drift region 1a along the body region 5 at least to the source region 15 so that an inversion channel, which is also referred to herein as a MOS-channel, may be formed by the field-effect in body region 5 along portion 13a forming a gate dielectric region. Accordingly, the semiconductor device 100 may be operated as a MOSFET.

The remaining portion of the dielectric region 13 forms an interlayer dielectric between a source metallization 10 and the gate electrode 12 and the first surface 101, respectively.

In the exemplary embodiment, the source metallization 10 electrically contacts the source region 15 and body contact region 5c (and thus the p-type compensation region 6) via a shallow trench contact formed through an interlayer dielectric 15 into the semiconductor body 40. In other embodiments, the source metallization 10 electrically contacts the source region 15 and body contact region 5c at the first surface 101.

According to an embodiment, the doping concentrations of the p-type compensation regions 6 and the first portions 1a of the drift region are chosen such that, in the off-state, their charges can be mutually depleted and that, in the on-state, an uninterrupted, low-resistive conduction path is formed from the source metallization 10 to the drain metallization 11.

According to another embodiment, the gate electrode 12 and gate dielectric 13a may be formed in a trench extending from the first surface 101 into the semiconductor body 40. In this embodiment, the body region 5 and source region 15 adjoin an upper part of the trench while the drift region 1a adjoins a lower part of the trench. In this embodiment, the drift region 1a may not extend to the first surface 101 in the active area.

In the exemplary embodiment illustrated in FIG. 1, below each p-type compensation region 6 a respective adjoining field plate 7 is arranged. Each field plate 7 is partly insulated by a respective insulating region 8 from a lower portion 1b of the drift region, which is in the following also referred to as second portion 1b of the drift region.

The field plates 7 may be arranged substantially centered with respect to a corresponding compensation region 6. In other embodiments, the field plates 7 are, in a horizontal direction, off-set with respect to the corresponding adjoining compensation regions 6.

The field plates 7 may be formed by a conductive region, for example a material with metallic or near-metallic electric conductivity such as a metal, a p-doped poly-silicon, a silicide or the like. Accordingly, each field plate 7 is in resistive electric connection through the adjoining p-type compensation region 6 with the source metallization 10. This means that there are respective low resistive current paths from the source metallization to the field plates 7 as long as the compensation regions 6 are not depleted in the blocking mode of the semiconductor device 100. When the semiconductor device 100 is commutated from the forward mode, in which for the illustrated n-channel MOSFET a drain voltage $V_D$ is applied to the drain metallization 11 which is lower than a source voltage $V_S$ applied to the drain metallization 11, to the blocking mode, in which the drain-source-voltage $V_{DS}=V_D-V_S$ is larger than zero and in which no channel regions are formed across the body regions 5, the field plates 7 substantially remain at the source potential $V_S$ as long as the compensation regions 6 and upper portions 1a of the drift region are not completely depleted. During commutating into the blocking mode the drain-source-voltage $V_{DS}$ rises with the source voltage $V_S$ being lower than the drain voltage $V_D$. This results in negatively charging the field plates 7 with electrons that can not reach the drain metallization 11 due to the shape of the insulating regions 8. Thus, the field plates 7 which are partly surrounded by respective insulating regions 8 form charge traps, electron traps in the exemplary embodiment. If the drain-source-voltage $V_{DS}$ becomes in the blocking mode larger than a threshold voltage of, for example 30V, the field plates 7 including the trapped charges are floating, since the low resistive current paths are broken by the completely depleted compensation regions 6 which substantially no longer include free charge carriers, in particular free majority charge carriers (electrons in the exemplary embodiment). Since the field plates 7 are charged already below the threshold voltage, a space charge region is formed from the charge traps 7, 8 into the lower portion 1b of the drift region already at low blocking voltages ($V_{DS}>0$). Depending on voltage class, the threshold voltage may range between about 3% to about 25% of a rated the breakdown voltage $V_{BR}$. For example, the threshold voltage may be about 10 V to about 20 V for a semiconductor device with a rated blocking voltage of 600 V. Accordingly, smallest values may be achieved for the electric energy $E_{OSS}$. Thus, the device behavior during hard commutating may be improved. Furthermore, the charge traps 7, 8 are typically self-adjusted with respect to the charge compensation. Accordingly, deviations of charge compensation due to manufacturing variations that may occur for the pn-charge compensation structures are avoided in the lower portion 1b of the drift region. This means that the pn-compensation structure formed by the p-type compensation regions 6 and the adjoining upper portions 1a of the drift region, which form n-type compensation regions 1a in the exemplary embodiment, may at given rated breakdown voltage $V_{BR}$ be manufactured with a higher charge compensation error and larger process window, respectively. As a rule of thumb, the charge compensation error for the upper compensation structure may be increased at a given rated breakdown voltage $V_{BR}$ by a factor of about $D_L/D_S$, for example 1.2 or 1.5, where dielectric layer and $D_S$ are the total vertical extension of the pn-compensation structure 6, 1a and the adjoining charge compensation structure formed by the charge traps 7, 8 and the intervening parts of the lower portion 1b of the drift region and the vertical extension the pn-compensation structure 6, 1a, respectively. This allows reducing the pitch of the p-type compensation regions 6 and hence the on-state resistance Ron at enlarged process window. Accordingly, a better device performance to cost ratio may be achieved.

When the semiconductor device 100 is switched back into the forward mode the trapped electrons flow towards the source metallization 10 where they are finally discharged. Accordingly, a low on-state resistance Ron is ensured.

The maximum doping concentration of the upper portion is typically lower than a maximum doping concentration of the lower portion 1b which is arranged substantially below the p-type compensation regions 6.

In the exemplary embodiment, not only the field plates 7 but also the insulating regions 8 adjoin respective p-type compensation regions 6 and the pn-junction formed between respective p-type compensation regions 6 and the drift region 1a, respectively. Accordingly, charges may be safely trapped in the charge traps 7, 8 during the blocking mode.

Typically, the charge traps 7, 8 are formed in vertical trenches 78. The insulating region 8 may be formed by dielectric layer(s) arranged on the bottom wall and sidewalls of the vertical trenches 78. Each field plate 7 adjoins at least one p-type compensation region 6 and typically fills at least a lower portion of the respective vertical trench 78. In the exemplary embodiment, the uppermost portion of each vertical trench 78 is filled by a lowermost portion of the adjoining p-type compensation region 6.

Furthermore, charge generation centers, such as lattice defects or impurities, for generating electron-hole pairs in an electric field may be formed in the field plate 7, for example at and/or close to junctions formed between the field plate 7 and the p-type semiconductor region 6 and respective $n^+$-type contact regions. For example, the field plates 7 may be comprised of a conductive material having a Fermi-energy which lies in the conduction band of the semiconductor material of the drift region 1a, 1b. For example, the field plates 7 may be comprised of a metal like wolfram or a silicide which have high charge generation rates in electric fields.

Alternatively, the field plates 7 may be comprised of a conductive semiconductor material with lattice defects such as highly doped poly-silicon or amorphous silicon. Lattice defects may also be formed by implantation. Furthermore, deep traps formed by implantation of Au, Cu or Pt into a semiconductor material of the field plates 7 and/or at the interface between the field plates 7 and the respective insulating region 8 may be used as charge generation centers. Even further, the field plates 7 may include one or more cavities. The interface between the semiconductor and a cavity may also form a generation center for electron-hole pairs.

In the vertical cross-section, the field plates 7 and charge traps 7, 8, respectively, have typically a larger vertical extension compared to a maximum horizontal extension. The insulating regions 8 may be substantially U-shaped or substantially V-shaped in the vertical cross-section.

Semiconductor device 100 illustrated in FIG. 1 is an exemplary vertical semiconductor device. The gate metallization for contacting the gate electrodes 12 may be arranged on the first surface 101. In other embodiments, the gate metallization is arranged on the second surface 102 and the gate electrodes 12 arranged next to the first surface 101 are contacted through a conductive via.

Furthermore, the self-adjusted charge traps 7, 8 as explained with regard to the vertical semiconductor device 100 and the vertical semiconductor devices explained below with regard to FIGS. 3 to 6 may also be used in lateral compensation MOSFETs with the source metallization 10, drain metallization 11 and the gate metallization being arranged on one surface. In these embodiments, the charge traps 7, 8 are also arranged in the drift region between respective adjoining first compensation regions (p-type in case of an n-channel MOSFET) and the drain metallization 11. In these embodiments, the charge traps 7, 8 are typically also orientated substantially in accordance with the electric field lines during the blocking mode.

For example, except for the drain metallization 11 the structures illustrated in FIG. 1 may also correspond to a substantially horizontal cross-section through a semiconductor body 40 of a lateral compensation MOSEFT 100. In this embodiment, the drain metallization 11 as well as the source and gate metallizations are typically arranged on a third surface which is substantially parallel to the cross-section of FIG. 1. This typically also applies to the FIGS. 3 to 5 explained below. Furthermore, in a respective cross-section, a maximum distance between a body region 5 and an adjoining p-type compensation region 6 is—both for vertical compensation MOSEFTs and lateral compensation MOSEFTs—typically lower than a maximum distance between the body region 5 and a charge trap 7, 8 which adjoins the adjoining p-type compensation region 6.

Figure 3:
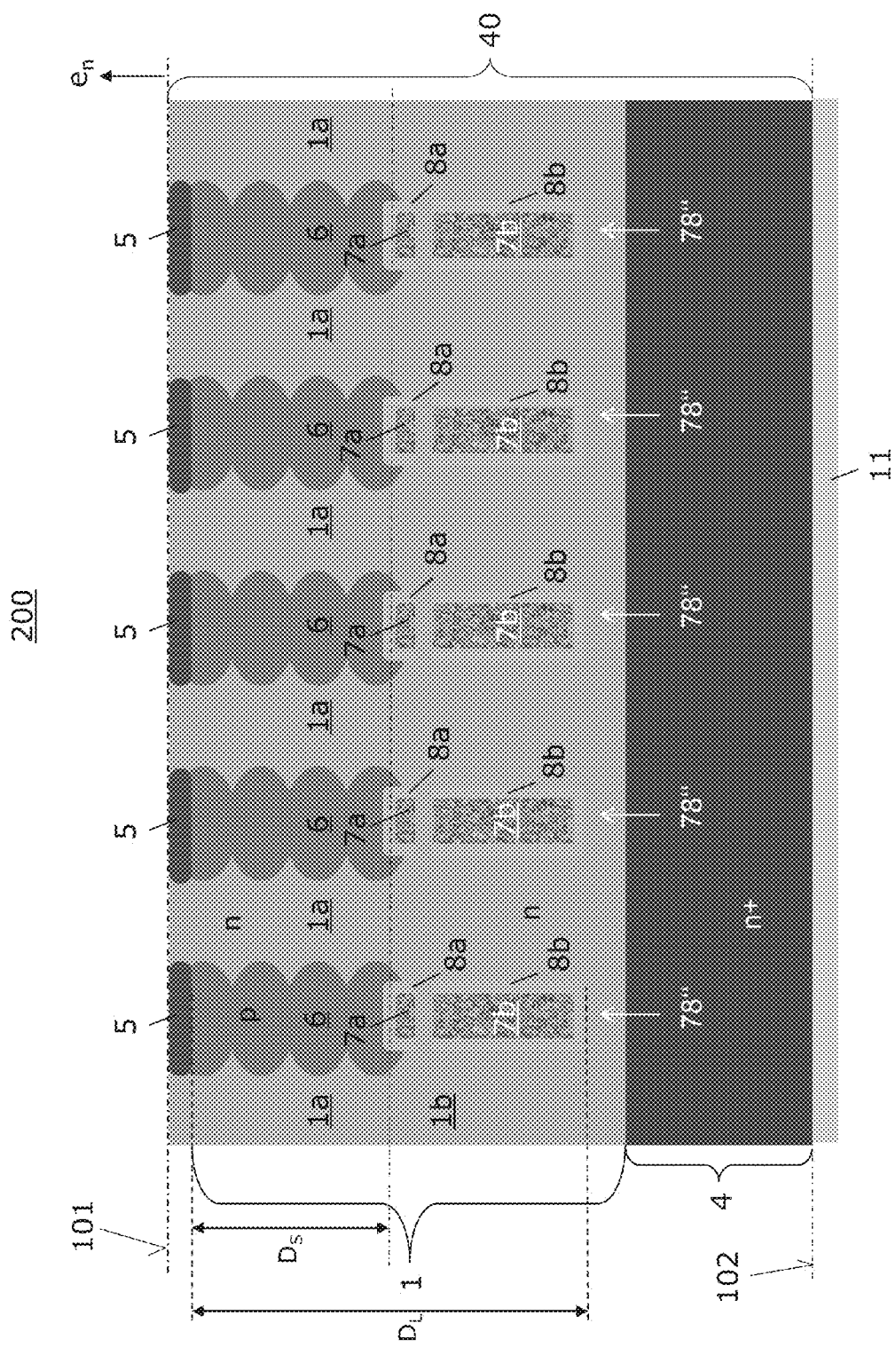
FIG. 3 illustrates a vertical cross-section through a semiconductor body of a semiconductor device according to an embodiment.

FIG. 3 illustrates a vertical cross-section through a semiconductor body 40 of a semiconductor device 200. Semiconductor device 200 is similar to semiconductor device 100 explained above with regard to FIGS. 1 and 2. However, each charge trap 7, 8 includes in the vertical cross-section a first part which adjoins a respective p-type compensation region 6 and a second part which is spaced apart from the first part. In the exemplary embodiment, the first part includes a first portion 7a of the field plate which is, in the vertical cross-section insulated from the adjoining p-type compensation region 6, by a substantially U-shaped insulating region 8a. The second part includes a second portion 7b of the field plate which is, in the vertical cross-section, partly insulated from the adjoining second portion 1b of the drift region 1a, 1b, by a substantially U-shaped insulating region 8b. The insulating regions 8a, 8b may, in the vertical cross-section, also be substantially V-shaped. Typically, the second part is, similar as explained above with regard to FIG. 1, formed in a vertical trench 78". The U-shaped insulating regions 8a, 8b are pairwise arranged below one another and such that, in the vertical cross-section, the first portion 7a is insulated at the top and at the side walls and the second portion 7b is insulated at the top and at the side walls. Thus, the first part forms an electron trap and the second part forms a hole trap. In other words, the charge trap 7a, 7b, 8a, 8b forms a combined electron-hole charge trap. Accordingly, the switching behavior of the semiconductor device 200 may be improved as the charges trapped in the blocking mode may eliminate each other when the semiconductor device 200 is commutated into the forward mode. Both the first portion 7a of the field plate and the second portion 7b of the field plate can be in resistive electric connection with the source metallization, in the forward mode and at low reverse voltage during the blocking mode. For example, the semiconductor device 200 may, in another vertical cross-section, substantially be formed as explained above with regard to FIG. 1. Accordingly, the first portion 7a of the field plate and the second portion 7b of the field plate may form a contiguous region.

In other embodiments, the first portion 7a of the field plate and the second portion 7b are not connected. In these embodiments, the second portion 7b of the field plate may not be in resistive electric connection with the source metallization. Still, the partly insulated second portion 7b may form a charge trap, i.e. an electron charge trap in the exemplary embodiment. In the event of a reverse voltage exceeding a threshold voltage of, for example, a tens, a fifth or a quarter of a rated blocking voltage or any value in between so that a space charge region extends to the second portion 1b, electron-hole pairs are generated at charge generating centers of the second portion 1b and separated in the electric field. The accumulating electrons in the second portions 1b of the charge trap form counter charges for fixed charges of the space charge region in the lower portion 1b of the drift region. Accordingly, self-charging electron traps are provided in the lower portion 1b of the drift region. Thus, any charge compensation mismatch is avoided.

Figure 4:
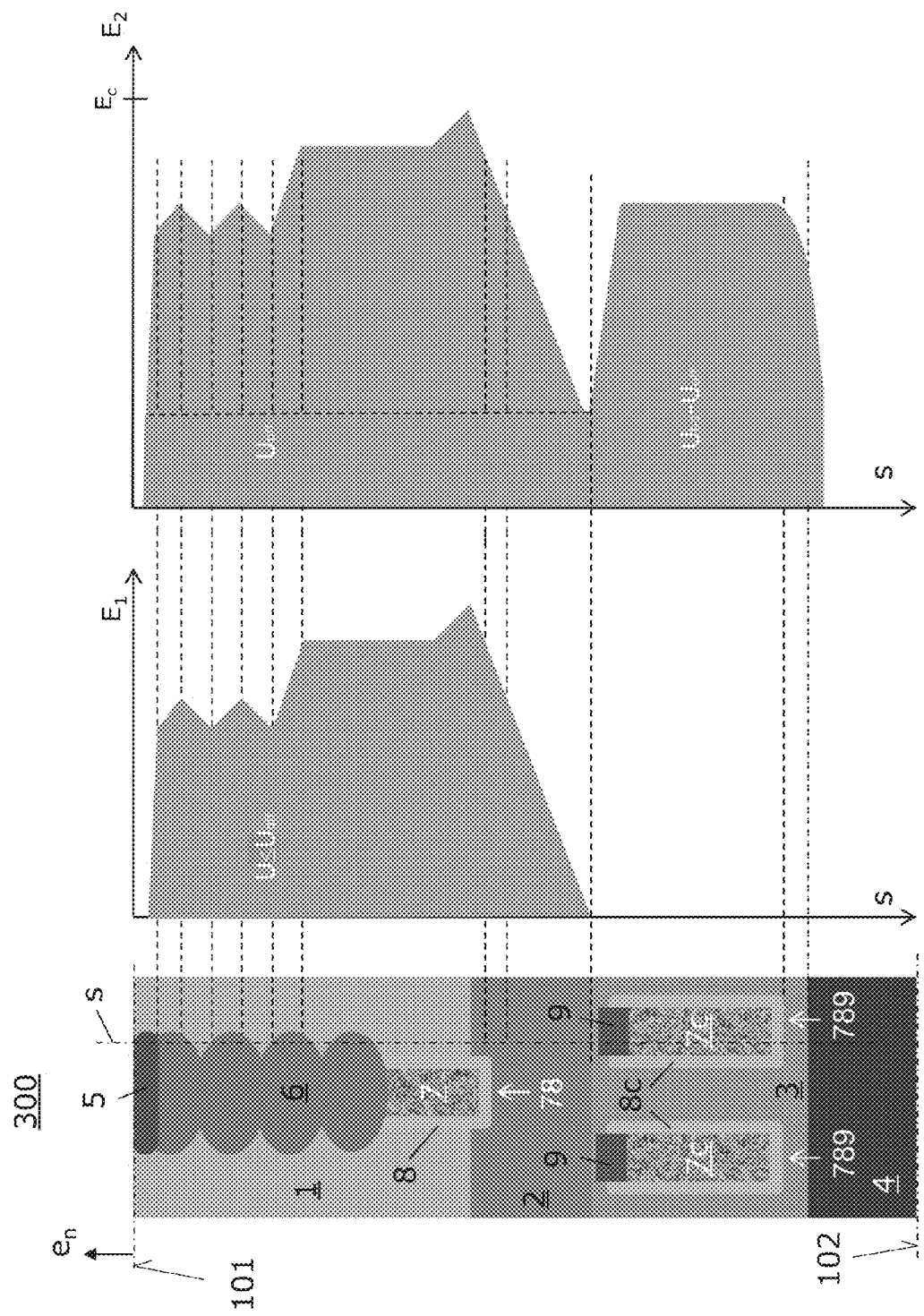
FIG. 4 illustrates a vertical cross-section through a semiconductor body of a semiconductor device and electric field distributions of the semiconductor device according to embodiments.

FIG. 4 illustrates a vertical cross-section through a semiconductor body 40 of a semiconductor device 300 and electric field distributions during the blocking mode of the semiconductor device 300. The semiconductor device 300 is similar to the semiconductor device 100 explained above with regard to FIGS. 1 and 2. However, a second semiconductor layer 2 and a third semiconductor layer 3 both of the first conductivity type, n-type in the exemplary embodiment, are additionally arranged between the drift region 1 and the drain region 4. Furthermore, the third semiconductor layer 3 includes two floating charge traps 7c, 8c, 9 arranged in vertical trenches 789 below the charge trap 7, 8. For sake of clarity only one charge trap 7, 8 and only two floating charge traps 7c, 8c, 9 are illustrated in FIG. 4.

The second semiconductor layer 2 may have the same maximum doping concentration as the drift region 1. The volume of the second semiconductor layer 2 which is arranged below the drift region 1 may be operated as a field stop at reverse voltages of about the nominal reverse off-voltage $U_{off}$ which is lower than the rated breakdown voltage $U_{bd}$. Accordingly, the second semiconductor layer 2 has typically a doping charge per horizontal area Q which is about $Q_c * U_{off}/U_{bd}$, for example about two thirds of the breakdown charge per area $Q_c$ of the used semiconductor material. For example, the breakdown charge per area $Q_c$ is, depending on doping concentration, about $2*10^{12}$ elementary charges per $cm^2$ to about $3*10^{12}$ elementary charges per $cm^2$ for silicon.

According to an embodiment, the third semiconductor layer 3 includes floating charge traps 7c, 8c, 9 which are configured to deplete the third semiconductor layer 3 when the second semiconductor layer 2 is punched through during the blocking-mode, i.e. when a space charge region formed between the p-type compensation regions 6 and the charge traps 7c, 8c extends through the second semiconductor layer 2. Thus, an avalanche breakdown of the semiconductor device 300 at voltages between a nominal reverse off-voltage $U_{off}$ and rated break-down voltage is avoided.

The floating charge traps 7c, 8c, 9 are formed similar to the charge traps 7, 8. However, p-type floating semiconductor regions 9 are arranged above and in contact with a respective floating field plate 7c including charge generation centers. Accordingly, the floating field plates 7c are not in direct contact with the third semiconductor layer 3 but in electric contact via respective pn-junctions formed between the third semiconductor layer 3 and the p-type floating semiconductor regions 9. In other embodiments, the p-type floating semiconductor regions 9 are slightly displaced to the floating field plates 7. This facilitates complete discharging of the charged floating field plates 7 when the semiconductor device 300 is switched again in forward-current direction. Alternatively, complete discharging of the charged floating field plates 7c may be facilitated by arranging interrupted ones of the p-type floating semiconductor regions 9 on the floating field plates 7c. For example, p-type floating semiconductor regions 9 may not be present in another vertical cross-section through semiconductor device 300. Due to the p-type floating semiconductor regions 9, the electric field in the third semiconductor layer 3 during the blocking-mode and high reverse voltages is increased compared to a semiconductor device without the p-type floating semiconductor regions 9.

In the event of a reverse voltage exceeding the nominal reverse off-voltage $U_{off}$, electron-hole pairs are generated at the charge generating centers of the floating field plates 7c and separated in the electric field. While the holes move in the electric field towards the source metallization and the first surface 101, respectively, the generated electrons remain trapped in the floating field plates 7 due to the insulating regions 8c. The generation of electron-hole pairs stops when the floating field plates 7c are sufficiently charged and substantially field-free. The trapped charges provide the counter charges for the fixed charges of the depleted portion of the third semiconductor layer 3. The insulating regions 8c may partly insulate the floating field plates 7 also on top.

In the exemplary embodiment illustrated in FIG. 4, the floating field plates 7c which are partially insulated by respective the insulating regions 8c form self-charging electron traps 7c, 8c. In other embodiments in which the third semiconductor layer 3 is of p-type, self-charging hole traps 7c, 8c are provided by the partially insulated floating field plates 7c.

When the semiconductor device 300 is switched again in forward current direction the charged floating field plates 7c and the field plates 7 are again discharged to maintain low on-resistance $R_{on}$.

In addition, FIG. 4 illustrates electric field distributions of the semiconductor device 300 during the blocking-mode along a vertical line s which runs partly through the p-type compensation regions 6 of semiconductor device 300. When a reverse voltage U at or below the nominal reverse off-voltage $U_{off}$ ($U \leq U_{off}$) is applied between the drain metallization and the source metallization, the reverse voltage U substantially drops across the drift region 1 and the p-type compensation region 6, respectively, and the second semiconductor layer 2 as shown by the electric field distribution $E_1$.

During the blocking-mode of the semiconductor device 300 and if the second semiconductor layer 2 is punched through, the floating field plates 7c are charged, i.e. negatively charged for an n-type third semiconductor layer 3. Accordingly, the third semiconductor layer 3 is horizontally depleted between the field plates 7c and thus an avalanche breakdown of the semiconductor device 300 at voltages between the nominal reverse off-voltage $U_{off}$ and rated break-down voltage $U_{bd}$ is avoided. Due to using the floating field plates 7c, doping concentration of the third semiconductor layer 3 may be comparatively high, for example substantially match the doping concentration of drift region 1. Thus, the on-state resistance $R_{on}$ of the semiconductor device 300 is typically kept low. Furthermore, the floating field plates 7c are only charged at exceptional high voltages above nominal reverse off-voltage $U_{off}$. Accordingly, switching-losses during normal operation of the semiconductor device 300 are kept low. Since reverse voltages above nominal reverse off-voltage $U_{off}$ are rare, the overall switching-losses of the semiconductor device 300 are typically lower compared to conventional compensation MOSFETs of same on-state resistance $R_{on}$. In other words, the trade-off between switching losses and forward current losses is improved. MOSFETs are in typical applications mainly exposed to reverse voltages which are significantly below the rated blocking voltage. Typically, MOSFETs are used in circuits with a designed circuit voltage during nominal operation which results in a nominal reverse voltages $U_c$ of only about 30% to about 70% of the rated blocking voltage, for example to about 400 V for a rated blocking voltage of 650V.

Figure 5:
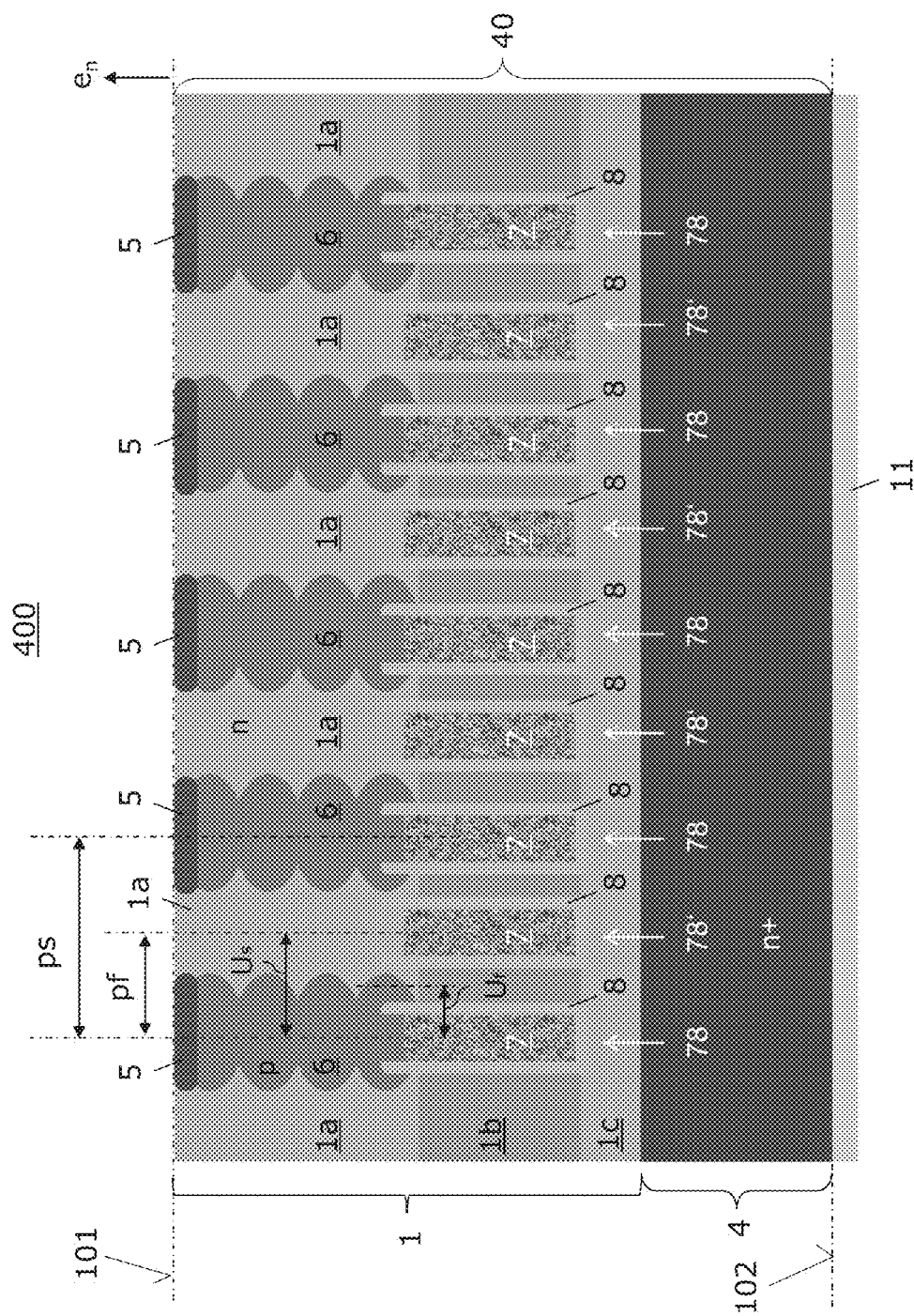
FIG. 5 illustrates a vertical cross-section through a semiconductor body of a semiconductor device according to an embodiment.

FIG. 5 illustrates a vertical cross-section through a semiconductor body 40 of a semiconductor device 400. The semiconductor device 400 is similar to the semiconductor device 100 explained above with regard to FIGS. 1 and 2. However, the n-type drift region includes three n-type portions: an upper portion 1a adjoining the p-type compensation regions 6, a lower portion 1b which includes at least major parts of the charge traps 7, 8 and a lowermost portion 1c which adjoins the drain region 4. The lower portion 1b of the drift region has typically a higher maximum doping concentration than the upper portion 1a and the lowermost portion 1c of the drift region. Furthermore, the field plates 7 of the charge traps 7, 8 which are arranged in the vertical trenches 78' do not adjoin a respective p-type compensation region 6 in FIG. 5. However, the field plates 7 of the charge traps 7, 8 which are arranged in the vertical trenches 78' may also be in resistive electric connection with the source metallization, for example in another vertical cross-section. The field plates 7 of the charge traps 7, 8 which are arranged in the vertical trenches 78' are in the following also referred to as third charge traps 7, 8.

Figure 6:
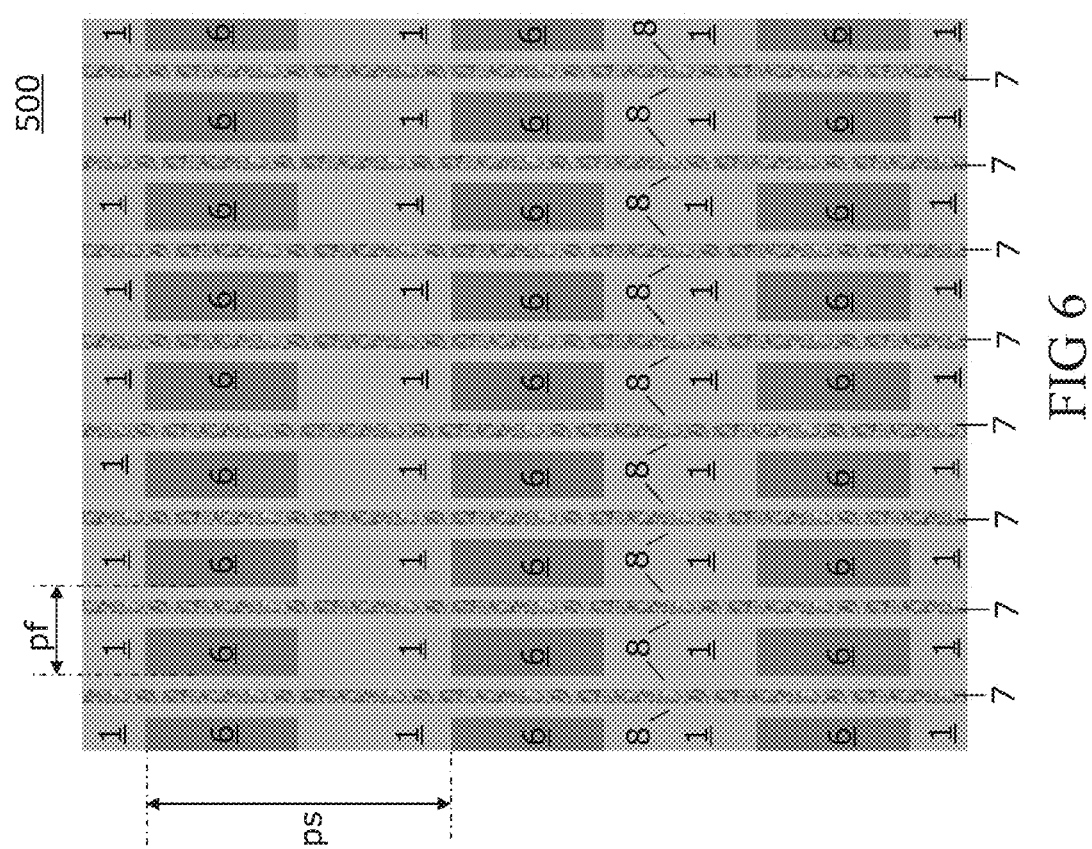
FIG. 6 illustrates a schematic plane view on the semiconductor body of a similar semiconductor device as illustrated in FIG. 5 according to an embodiment.

According to an embodiment, the p-type compensation regions 6 and all charge traps 7, 8 are, in a horizontal cross-section, i.e. in a second cross-section which is substantially orthogonal to the vertical cross-section, shaped as substantially parallel bars which are tilted with respect to each other, for example by about 90° as illustrated in FIG. 6 showing a horizontal cross-section through a semiconductor device 500 which is similar to the semiconductor device 400 illustrated in FIG. 5. Accordingly, each field plate 7 of the semiconductor device 400, 500 may adjoin a plurality of the p-type compensation regions 6. In other embodiments, the p-type compensation regions 6 and charge traps 7, 8 are, in a horizontal cross-section and when seen from above, respectively, shaped as circles, ellipses, polygons or substantially ring-shaped.

In other embodiments, the field plates 7 of the charge traps 7, 8 which are arranged in the vertical trenches 78' are not in resistive electric connection with the source metallization and include charge generating centers. Accordingly the third charge traps form self-charging charge traps similar as explained above with regard to FIG. 3.

Typically, the plurality of compensation regions 6 forms a first lattice when seen in a normal direction $e_n$ of the first surface 101 and the plurality of charge traps 7, 8 form a second lattice when seen in the normal direction $e_n$.

The first lattice and second lattice may be tilted with respect to each other. This facilitates fine-tuning of the device parameters to obtain both low electric energy $E_{OSS}$ and on-resistance Ron. More typically, a lattice constant or pitch pf of the second lattice is smaller than a lattice constant or pitch ps of the first lattice as illustrated in FIGS. 4, 5 to obtain both lowest electric energy $E_{OSS}$ and lowest on-resistance Ron. For this purpose a maximum horizontal voltage drop Us between a p-type compensation region 6 and the first portion 1a of the drift region and a maximum horizontal voltage drop Uf between a field plate 7 and the second portion 1b of the drift region should be substantially equal in blocking mode. Given an exemplary blocking voltage of about 150 V of the layer 1b including the charged traps 7, 8 in FIG. 5, the charge compensation structure 1a, 6 has to withstand about 75% of a rated blocking voltage of 600 V. As a rule of thumb, the total on-resistance $R_{on1}$ is, under these assumptions, $$R_{on1} = R_{on2}\left(0.75 + 0.25 \cdot \frac{f(p_f)}{p_s^2}\right)$$

where $R_{on2}$ is the on-resistance of a similar semiconductor device with a rated blocking voltage of 600 V but without the second portion 1b including the charged traps 7, 8.

For a larger pitch ps of the p-type compensation regions, a significant reduction of the on-resistance may be achieved. If the pitch ps of the p-type compensation regions 6 is comparatively small, the reduction of the on-resistance is smaller.

However, manufacturing of charged traps 7, 8 is more cost-efficient than manufacturing conventional pn-compensation structures. Accordingly, a cost-performance factor ($R_{on}$ times area times cost) may be reduced by up to about 30%.

Figure 7:
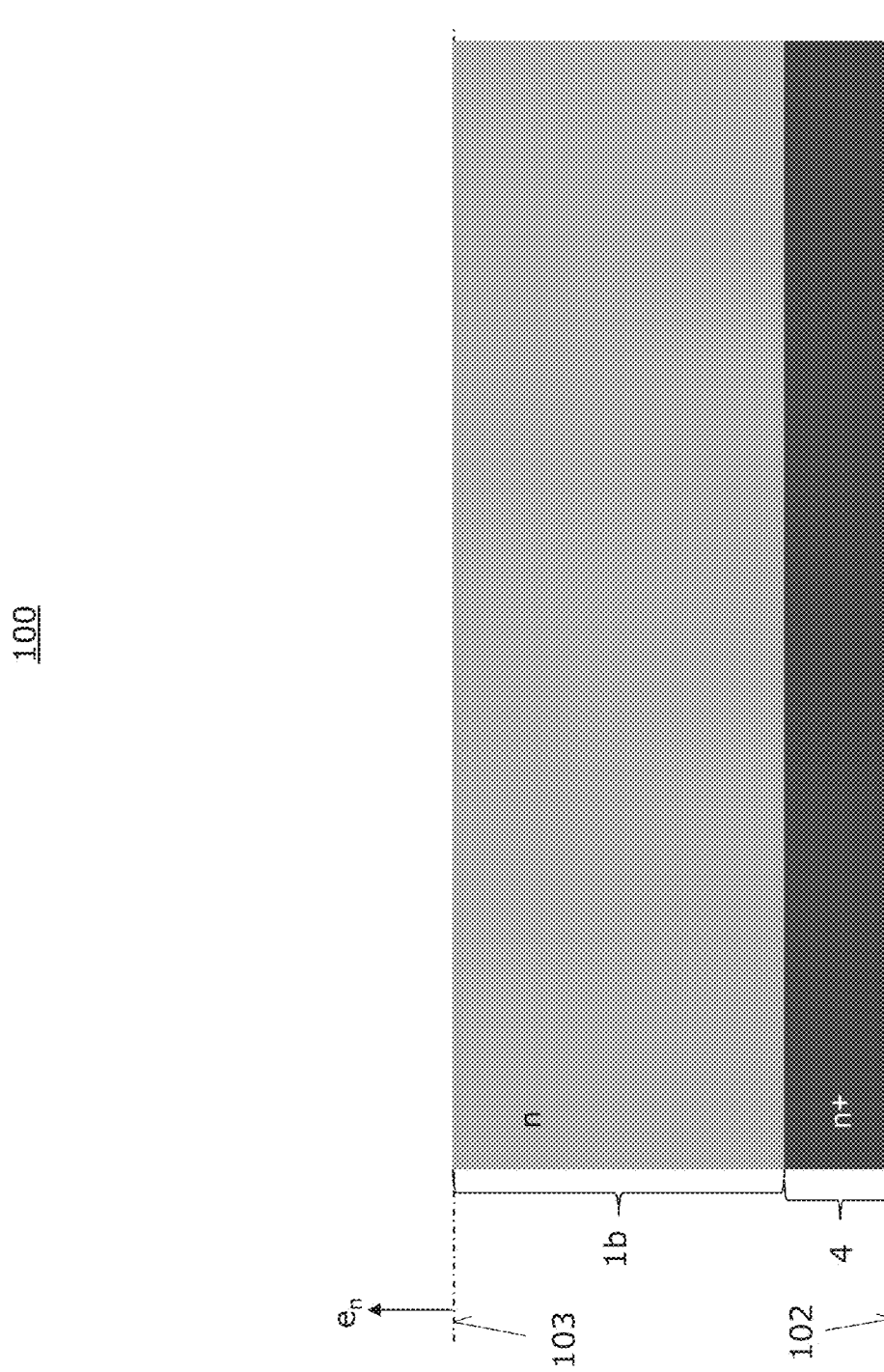
FIGS. 7 to 9 illustrate vertical cross-sections through a semiconductor body during method steps of a method according to embodiments.
Figure 8:
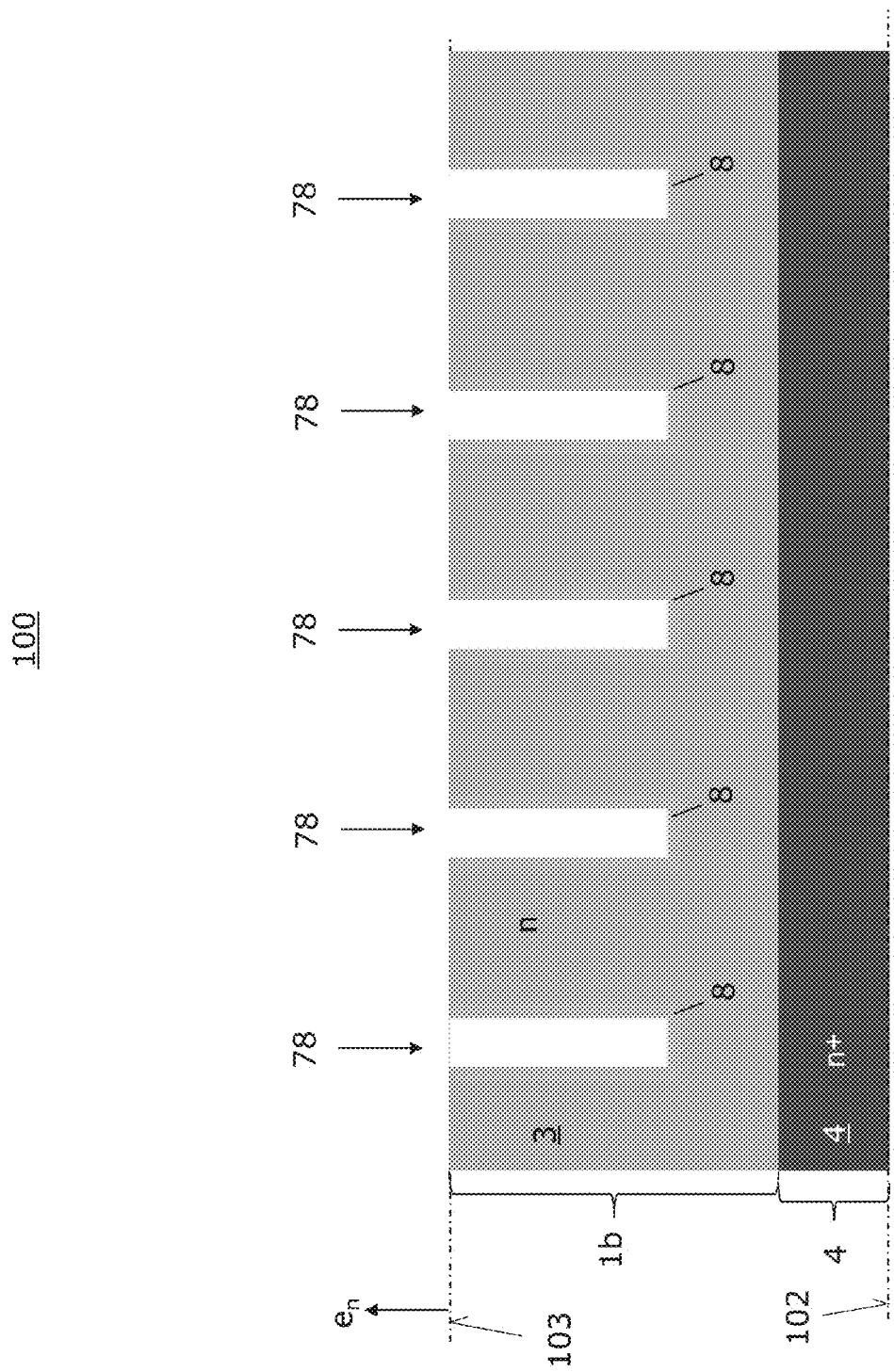
Figure 9:
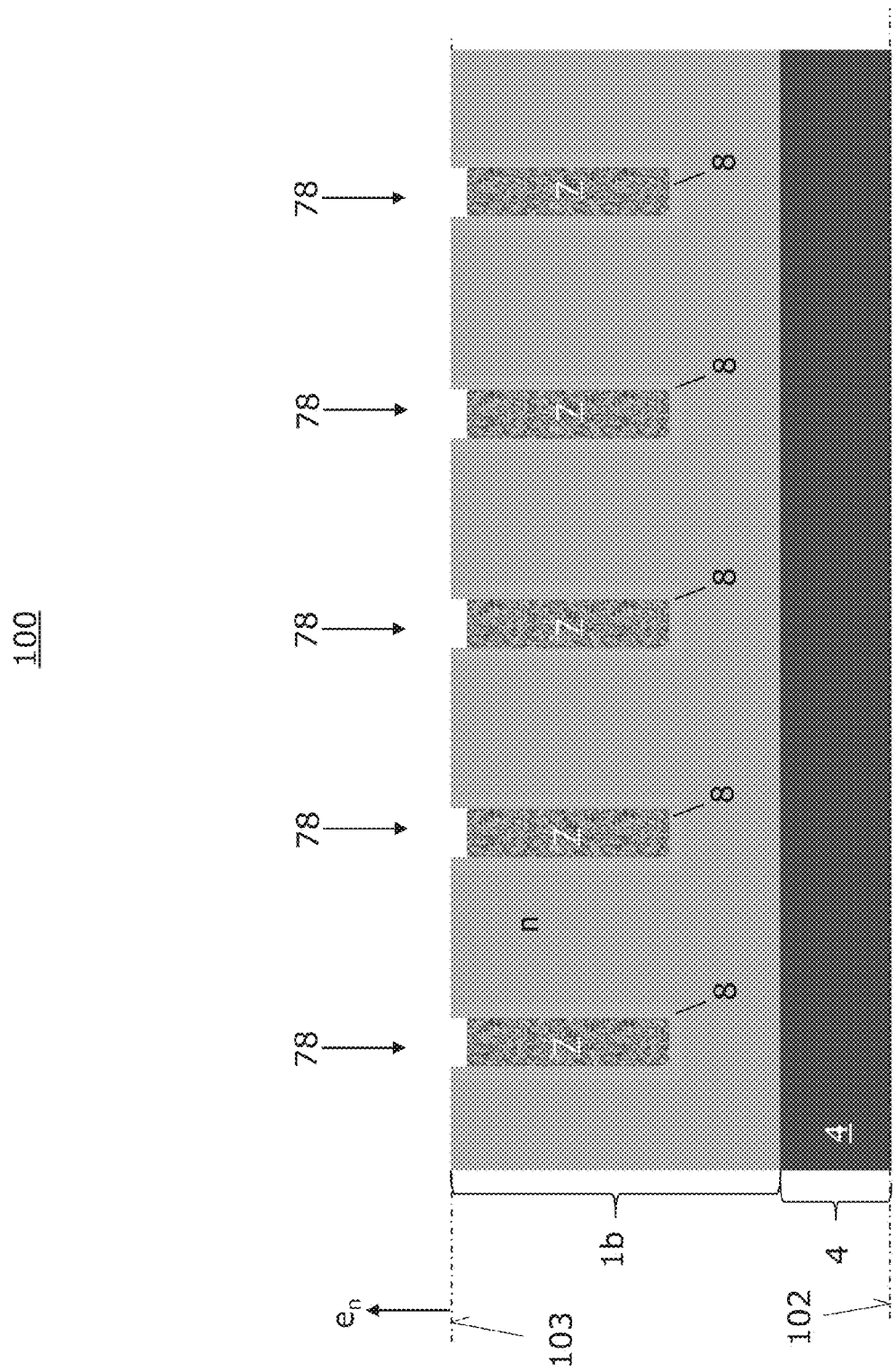

FIGS. 7 to 9 illustrate a method for forming a semiconductor device 100 according to several embodiments. These figures show vertical cross-sections through a semiconductor body during or after particular method steps. In a first process, a semiconductor body, for example a wafer or substrate, having a main or top surface 103 and a second or backside surface 102 arranged opposite the top surface 103 is provided. The normal direction $e_n$ of the top surface 103 defines a vertical direction. As illustrated in FIG. 7, the semiconductor body typically includes an $n^+$-type fourth semiconductor layer 4 which extends to the second surface 102 and typically forms a drain layer of the semiconductor device to be produced. An n-type semiconductor layer 1b is arranged on the fourth semiconductor layer 4 and extends to the top surface 103. The semiconductor layer 1b may form a lower drift layer or drift region 1b of the semiconductor device to be manufactured.

Referring to FIG. 8, vertical trenches 78 are etched from the top surface 103 into the semiconductor layer 1b. Further, the side walls and bottom walls of the vertical trenches 78 are insulated by insulating regions 8. This may be done by deposition and/or thermal oxidation and removal of the formed dielectric layer from the top surface 103. Alternatively, a dielectric layer or a hardmask used for forming the vertical trenches 78 may be used as etch-stop for subsequent forming of field plates and removed thereafter.

Referring to FIG. 9, field plates 7 are formed in the vertical trenches 78. Forming the field plates 7 may include depositing a conductive material such as a metal like wolfram, a highly doped p-type poly-crystalline silicon, a highly p-type doped amorphous silicon or a highly doped p-type porous silicon, and back-etching of the deposited conductive material.

The field plates 7 may be formed such that charge generation centers are included in the field plates 7. For example, lattice defects may be formed in the conductive material by implantation. Alternatively or in addition, deep traps may be formed by implanting Au, Cu or Pt into a deposited semiconductor material of the floating field plates 7 and/or at the interface between the floating field plates 7 and the respective insulating region 8.

Thereafter, several n-type epitaxial layers are typically deposited on the top surface 103 and ion implantations processes are performed to form an n-type upper drift layer 1a arranged on the lower drift layer 1b and extending to a first surface 101, and to form compensations regions 6 and body regions 5 in the first semiconductor layer 1. Typically, the compensation regions 6 are formed as substantially vertically orientated pillars or substantially vertically orientated strip-type parallelepipeds.

Ion implantation processes are typically performed with an integral ion dose such that remaining portions 1a of the first semiconductor layer 1 forming upper drift regions are substantially depleted when a reverse voltage of about a reverse threshold voltage which is lower than a rated breakdown voltage of the semiconductor device, is applied across semiconductor body in reverse current direction which corresponds to reverse biasing the pn-junctions formed between the compensation regions 6 and drift region 1a.

Alternatively, the compensation regions 6 may be formed by etching vertical trenches in the one or more epitaxial layers deposited on the lower drift layer 1b and filling the vertical trenches with a p-type semiconductor material.

Thereafter $n^+$-type source regions, p-type body regions and $p^+$-type body contact regions may be formed by implantations. Further, insulated gate electrodes are typically formed on a first surface 101 to which the first semiconductor layer 1 extends. An interlayer dielectric is typically formed on the first surface 101 and recessed above the source and body regions.

Thereafter, a source metallization in low resistivity contact with the source regions, body contact regions and thus with the body regions 5, compensation regions 6 and field plates 7 are formed on the first surface 101. Furthermore, a gate metallization in low resistivity contact with the gate electrodes may be formed on the first surface 101. To form a three-terminal n-channel MOSFET, a drain metallization is deposited on the second surface 102. The resulting semiconductor device 100 is illustrated in FIGS. 1, 2. A similar p-channel MOSFET may be formed with opposite doping relations.

The formed semiconductor device is typically a vertical MOSFET, more typically a vertical power MOSFET with the source metallization and the gate metallization on the first surface 101. Alternatively, the gate metallization may be formed and arranged, respectively, on the second surface 101.

According to an embodiment a semiconductor device includes a semiconductor body having a first surface defining a vertical direction and a source metallization arranged on the first surface. In a vertical cross-section the semiconductor body further includes: a drift region of a first conductivity type; a first body region of a second conductivity type, a first compensation region of the second conductivity type which adjoins the first body region, has a lower maximum doping concentration than the first body region, forms a first pn-junction with the drift region and is in resistive electric connection with the first metallization, and a first charge trap. The first charge trap is arranged below the first surface, spaced apart from the first body region and includes a field plate in resistive electric connection with the source metallization, and an insulating region which adjoins the drift region and partly surrounds the field plate.

According to an embodiment, a semiconductor device includes a semiconductor body and a source metallization. The semiconductor body has a first surface and includes a drift region of a first conductivity type, a plurality of compensation regions of a second conductivity type each of which forms a pn-junction with the drift region and adjoins a respective body region of the second conductivity type which has a higher maximum doping concentration than the adjoining compensation region, i.e. the compensation region the respective body region adjoins, and a plurality of charge traps each of which comprises a field plate and a insulating region which partly surrounds the field plate. Each of the field plates of the plurality of charge traps adjoins at least one of the plurality of compensation regions. The source metallization is arranged on the first surface and is in resistive electric connection with each of the compensation regions.

According to an embodiment the method for producing a vertical semiconductor device includes: providing a semiconductor body of a first conductivity type having a top surface defining a vertical direction and a backside surface arranged opposite to the top surface; forming in the semiconductor body from the top surface a plurality a charge trap structures each of which comprises a field plate which is partly surrounded by a insulating region; forming on the top surface an upper drift layer of the first conductivity type comprising a plurality of compensation regions of a second conductivity type, so that each compensation region forms a respective pn-junction within the upper drift layer and that each compensation region adjoins at least one of the charge trap structures; and, forming a source metallization in resistive electric connection with each of the plurality of compensation regions.

In another embodiment, a lateral MOSFET, more typically a lateral power MOSFET is formed. In this embodiment, the portions 1a, 1b of the drift region and the drain region 4 are, in the vertical cross-section, arranged side by side.

Forming a lateral MOSFET typically also includes the processes of providing a semiconductor body having a main surface 103 with a normal direction and a backside surface 102 arranged opposite and comprising a semiconductor layer 1b of a first conductivity type extending to the main surface 103 (see FIG. 7); forming in the semiconductor body a plurality of charge trap structures 7, 8 each of which comprises a field plate 7 which is, in a cross-section which is substantially orthogonal to the main surface 103, partly surrounded by an insulating region 8; forming a plurality of compensation regions 6 of a second conductivity type so that each compensation region 6 forms a respective pn-junction within the semiconductor body and that each compensation region 6 adjoins, in the cross-section, at least one of the charge trap structures 7, 8; and forming a source metallization 10 in resistive electric connection with each of the plurality of compensation regions. However, forming the charge trap structure typically includes etching trenches 78 into the semiconductor body from a third surface of the semiconductor body which is substantially orthogonal to the main surface, i.e. substantially parallel to the cross-section illustrated in FIG. 7, instead of etching trenches 78 from the main surface into the semiconductor body as explained with regard to FIG. 8. In other words, the main surface and the back surface are typically formed by lateral surfaces of the semiconductor body and semiconductor wafer, respectively, in case of lateral MOSFETs. Furthermore, the trenches 78 formed for the charge trap structures 7, 8 may be formed together with additional trenches to be filled with a semiconductor material of the second conductivity type for forming the compensation regions 6. Furthermore, forming of epitaxial layers is not required for forming the pn-compensation structure in this process sequence. Accordingly, manufacturing of lateral compensation MOSFETS with charge traps may be facilitated. The other processes may be performed similar as explained above with regard to FIGS. 7 to 9 for vertical MOSFETs. The source metallization 10, the drain metallization 11 and the gate metallization are typically formed on the third surface during manufacturing of lateral MOSFETs. Further, the insulated gate electrodes are typically formed next to the third surface during manufacturing of lateral MOSFETs.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Such modifications to the inventive concept are intended to be covered by the appended claims.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
   a semiconductor body comprising in a first cross-section:
      a drift region of a first conductivity type;
      a first body region of a second conductivity type which adjoins the drift region;
      a first compensation region of the second conductivity type which adjoins the first body region, has a lower maximum doping concentration than the first body region and forms a first pn-junction with the drift region; and
      a first charge trap adjoining the first compensation region and comprising a field plate and an insulating region which adjoins the drift region and partly surrounds the field plate; and
   a source metallization arranged on the semiconductor body and in resistive electric connection with the first body region.

2. The semiconductor device of claim 1, further comprising in the first cross-section:
   a second body region of the second conductivity type which is spaced apart from the first body region and in resistive electric connection with the first body region;
   a second compensation region of the second conductivity type which adjoins the second body region, has a lower maximum doping concentration than the second body region, forms a second pn-junction with the drift region and is in resistive electric connection with the source metallization; and
   a second charge trap adjoining the second compensation region and comprising a field plate and an insulating region which adjoins the drift region and partly surrounds the field plate.

3. The semiconductor device of claim 2, wherein the first charge trap adjoins the second compensation region.

4. The semiconductor device of claim 2, wherein the semiconductor body comprises a first surface having a normal direction defining a vertical direction, wherein the source metallization is arranged on the first surface, and wherein the cross-section is a vertical cross-section, the semiconductor device further comprising a drain metallization arranged opposite to the source metallization and in resistive electric connection with the drift region, wherein the field plate has a minimum distance to the first surface, and wherein a space charge region extends in the drift region between the first compensation region and the second compensation region and vertically below the minimum distance when a reverse voltage is applied between the source metallization and the drain metallization which is higher than a threshold voltage, and wherein the threshold voltage is not larger than about a quarter of a rated blocking voltage of the semiconductor device.

5. The semiconductor device of claim 1, wherein the field plate comprises, in the first cross-section, a first portion which adjoins the first compensation region and a second portion which is spaced apart from the first portion.

6. The semiconductor device of claim 1, wherein the field plate is in resistive electric connection with the source metallization.

7. The semiconductor device of claim 1, wherein the field plate comprises at least one charge generating center.

8. The semiconductor device of claim 1, wherein the field plate comprises at least one of a cavity, a polycrystalline semiconductor material, an amorphous semiconductor material, a semiconductor material comprising lattice defects, a semiconductor material with impurities forming deep traps, a p-doped silicon, a silicide and a metal.

9. The semiconductor device of claim 1, wherein the insulating region adjoins the first pn-junction.

10. The semiconductor device of claim 1, wherein the insulating region is, in the first cross-section, substantially U-shaped or V-shaped.

11. The semiconductor device of claim 1, wherein the insulating region comprises, in the first cross-section, a first portion which is arranged between the field plate and the first compensation region and adjoins the field plate at least at a top side of the field plate, and a second portion which is spaced apart from the first portion and adjoins at least a bottom side of the field plate, the bottom side being arranged opposite to the top side.

12. The semiconductor device of claim 11, wherein at least one of the first portion and the second portion is substantially U-shaped or V-shaped.

13. The semiconductor device of claim 1, wherein the drift region comprises a first portion of the first conductivity type having a first maximum doping concentration and adjoining the first body region, and a second portion of the first conductivity type which adjoins the first portion of the drift region and the first charge trap and comprises a second doping concentration which is higher than the first doping concentration.

14. The semiconductor device of claim 1, wherein the semiconductor body comprises a first surface having a normal direction defining a vertical direction, wherein the source metallization is arranged on the first surface, and wherein the first charge trap is, in the first cross-section, arranged substantially below the first compensation region.

15. The semiconductor device of claim 2, further comprising a third charge trap which is, in the first cross-section, arranged between the first charge trap and the second charge trap, and comprises a field plate and an insulating region which adjoins the drift region and partly surrounds the field plate.

16. The semiconductor device of claim 15, wherein the first compensation region and the second compensation region are, in a second cross-section which is substantially orthogonal to the first cross-section, shaped as substantially parallel bars, and wherein the field plates of the first, second and third charge traps are, in the second cross-section, shaped as bars which are substantially parallel to each other and tilted with respect to the first compensation region and the second compensation region.

17. The semiconductor device of claim 1, further comprising:
a drain region of the first conductivity type comprising a maximum doping concentration which is higher than a maximum doping concentration of the drift region; and
a third semiconductor layer of the first conductivity type arranged between the drift region and the drain region and comprising at least one of a floating field plate and a floating charge trap.

18. The semiconductor device of claim 1, wherein the first compensation region is, in the first cross-section, formed as one of a pillar which is substantially orientated in a normal direction of the first cross-section and a strip-type parallelepiped which is substantially orientated in the normal direction.

19. A semiconductor device, comprising:
a semiconductor body having a first surface and comprising a drift region of a first conductivity type, a plurality of compensation regions of a second conductivity type each of which forms a pn-junction with the drift region and adjoins a respective body region of the second conductivity type which has a higher maximum doping concentration than the adjoining compensation region, and a plurality of charge traps each of which comprises a field plate and a insulating region which partly surrounds the field plate, wherein each of the plurality of charge traps adjoins at least one of the plurality of compensation regions; and
a source metallization arranged on the first surface and in resistive electric connection with each of the compensation regions.

20. The semiconductor device of claim 19, wherein the plurality of compensation regions forms a first lattice when seen in a normal direction of the first surface, and wherein the plurality of charge traps forms a second lattice when seen in the normal direction.

21. The semiconductor device of claim 20, wherein a lattice constant of the second lattice is smaller than a lattice constant of the first lattice.

22. The semiconductor device of claim 20, wherein the second lattice is tilted with respect to the first lattice.

23. A method for producing a semiconductor device, comprising:
providing a semiconductor body having a main surface with a normal direction and comprising a semiconductor layer of a first conductivity type extending to the main surface;
forming in the semiconductor body a plurality of charge trap structures each of which comprises a field plate which is, in a cross-section which is substantially orthogonal to the main surface, partly surrounded by an insulating region;
forming a plurality of compensation regions of a second conductivity type so that each compensation region forms a respective pn-junction within the semiconductor body and that each compensation region adjoins, in the cross-section, at least one of the charge trap structures; and
forming a source metallization in resistive electric connection with each of the plurality of compensation regions.

24. The method of claim 23, wherein forming the charge trap structures comprises at least one of:
etching trenches from the main surface into the semiconductor body;
etching trenches into the semiconductor body from a surface of the semiconductor body which is substantially orthogonal to the main surface;
insulating side walls and bottom walls of the trenches;
at least partly filling each of the trenches with a conductive region; and
forming charge generating centers in at least one of the conductive regions.

25. The method of claim 23, wherein forming the plurality of compensation regions comprises at least one of:
- forming at least one epitaxial layer of the first conductivity type on the semiconductor layer using epitaxial deposition;
- masked implanting of dopants of the second conductivity type in the at least one epitaxial layer;
- etching additional trenches into at least one of the semiconductor body and the at least one epitaxial layer; and
- filling the additional trenches with a semiconductor material of the second conductivity type.

* * * * *